(12) United States Patent
Llewellyn et al.

(10) Patent No.: US 8,831,230 B2
(45) Date of Patent: Sep. 9, 2014

(54) AMPLIFIER CROSSTALK CANCELLATION TECHNIQUE

(75) Inventors: William D. Llewellyn, San Jose, CA (US); Carmine Cozzolino, Encinitas, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 383 days.

(21) Appl. No.: 13/272,021

(22) Filed: Oct. 12, 2011

(65) Prior Publication Data

US 2012/0262230 A1    Oct. 18, 2012

Related U.S. Application Data (60) Provisional application No. 61/475,810, filed on Apr. 15, 2011.

(51) Int. Cl.
| | | |
|---|---|---|
| *H04H 20/47* | (2008.01) | |
| *H03F 3/68* | (2006.01) | |
| *H03F 3/45* | (2006.01) | |
| *H03F 3/187* | (2006.01) | |

(52) U.S. Cl.
CPC .. *H03F 3/45475* (2013.01); *H03F 2203/45522* (2013.01); *H03F 3/68* (2013.01); *H03F 2203/45591* (2013.01); *H03F 3/187* (2013.01)
USPC ......... 381/2; 381/1; 381/74; 381/28; 381/111

(58) Field of Classification Search
CPC .............. H04R 5/00; H04R 1/00; H04R 5/02; H04H 20/47
USPC .................. 381/17, 309, 74, 26, 1–2, 28, 111
See application file for complete search history.

(56) References Cited

U.S. PATENT DOCUMENTS

| | | | | |
|---|---|---|---|---|
| 5,537,668 A | * | 7/1996 | Nambu et al. .................. | 381/102 |
| 7,925,030 B2 | * | 4/2011 | Holmstrom et al. ............ | 381/74 |
| 8,130,972 B2 | * | 3/2012 | Suzuki ............................ | 381/74 |

FOREIGN PATENT DOCUMENTS

| | | |
|---|---|---|
| CN | 102739176 A | 10/2012 |
| KR | 10-2012-0117685 | 10/2012 |

OTHER PUBLICATIONS

"Chinese Application Serial No. 201220159022.9, Voluntary Amendment filed May 2, 2012", 3 pgs.
"Korean Application Serial No. 10-2012-0038599, Voluntary Amendments filed Apr. 24, 2012", 8 pgs.

* cited by examiner

*Primary Examiner* — Disler Paul
(74) *Attorney, Agent, or Firm* — Schwegman, Lundberg & Woessner, P.A.

(57) ABSTRACT

This document discusses apparatus and methods for configuring and providing crosstalk cancellation to maintain channel separation in a multi channel system. In an example, an amplifier circuit can include a crosstalk cancellation circuit configured to reduce crosstalk from a first output to a second load and from a second output to a first load where the first load and the second load share a return path.

20 Claims, 5 Drawing Sheets

AMPLIFIER CROSSTALK CANCELLATION TECHNIQUE

CLAIM OF PRIORITY

This patent application claims the benefit of priority, under 35 U.S.C. Section 119(e), to Llewellyn et al., U.S. Provisional Patent Application Ser. No. 61/475,810, entitled "AMPLIFIER CROSSTALK CANCELLATION TECHNIQUE," filed on Apr. 15, 2011, which is hereby incorporated by reference herein in its entirety.

BACKGROUND

The degree of separation of the left and right channels in a stereo high-fidelity audio system can be a standard figure of merit. Intermixing of the two channels can reduce the separation and compromise listening quality. In stereo headphones, a portion of the ground/negative current return path for both of the left and right channels can share a common conductor for a finite physical distance, for example, between the driving amplifier IC output and the sleeve terminal of the headphone jack or connector. In some cases, the finite physical distance can include the full length of the headphone cable. This shared length of conductor has non-zero impedance, and current flowing through each earpiece can develop a voltage across the parasitic impedance that results in a small amount of its signal appearing at the negative terminal of the opposite earpiece, producing bleed-over or crosstalk.

OVERVIEW

The present subject matter relates to multi-channel systems and more particularly to techniques to maintain channel separation within such systems. Examples are provided that include apparatus and methods for configuring and providing crosstalk cancellation to maintain channel separation in a multi channel system. In an example, an amplifier circuit can include a crosstalk cancellation circuit configured to reduce crosstalk from a first output to a second load and from a second output to a first load where the first load and the second load share a return path.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
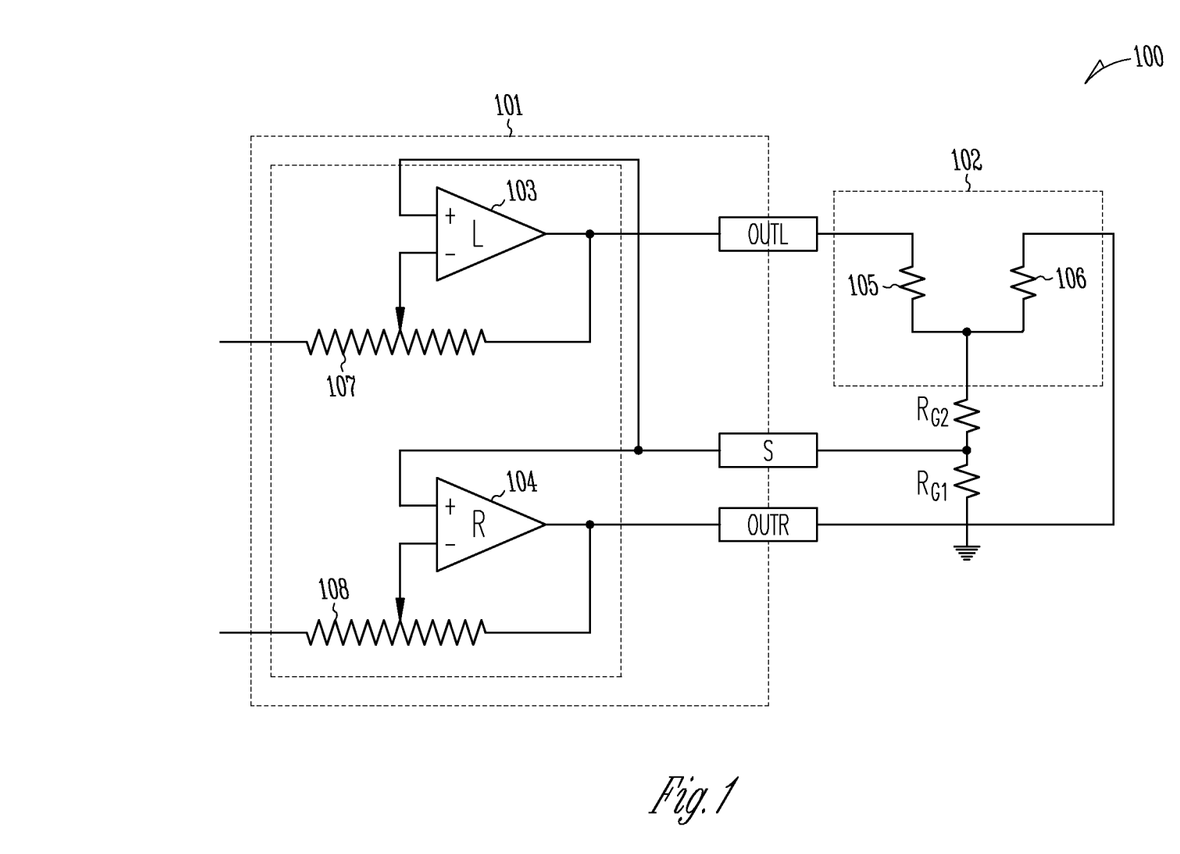
FIG. 1 illustrates generally an existing headphone amplifier design.

FIG. 1 illustrates generally an existing headphone amplifier system 100 that incorporates a ground voltage sensing technique with a connection to a point physically located near the ground return terminal of a multi-channel load. The system 100 can include an amplifier circuit 101 coupled to a multi-channel load 102, such as an audio transducer including, but not limited to, a set of headphones or a pair of earpieces 105, 106. The amplifier circuit 101 can include an amplifier for each broadcast channel, such as a left channel amplifier 103 for the left earpiece 105 and a right channel amplifier 104 for the right earpiece 106. In certain examples, the amplifier circuit 101 can include gain control or volume control devices 107, 108 for each channel. The amplifier circuit 101 can be coupled to the multi-channel load 102 using one or more nodes or terminals (e.g., OUTL, OUTR, S, etc.) or a connector for connecting the one or more nodes or terminals. In certain systems, the left and right earpieces 105, 106 can share a return path, such as a conductor to ground. Although the return path impedance (e.g., $R_{G1}+R_{G2}$) can be low, current from one channel can flow through the return path impedance and can develop crosstalk voltage on another channel that shares the return path.

Referring to the example of FIG. 1, current flowing through one earpiece, for example, the left earpiece 105, can develop a voltage across an impedance (e.g., $R_{G1}$) that is fed back to both the left and right channel amplifiers 103, 104 in a non-inverting fashion. Such feedback can partially cancel the left channel crosstalk into the right earpiece 106 by producing a signal at a right channel amplifier 104 output node (OUTR) proportional to a signal at a sense node (S). The same can hold true for crosstalk from the right channel into the left earpiece 105. Ideal cancellation may not be achieved, however, for at least two reasons. First, the connector, such as a Kelvin-type connector, can leave at least a portion of the parasitic impedance (e.g., represented by impedance $R_{G2}$) un-sensed. Second, the gain of the cancellation signal from the sense node (S) to the right channel amplifier 104 output node (OUTR) can vary with the gain setting of the amplifier circuit 101, thus, allowing the cancellation signal to vary from an optimal setting.

Figure 2:
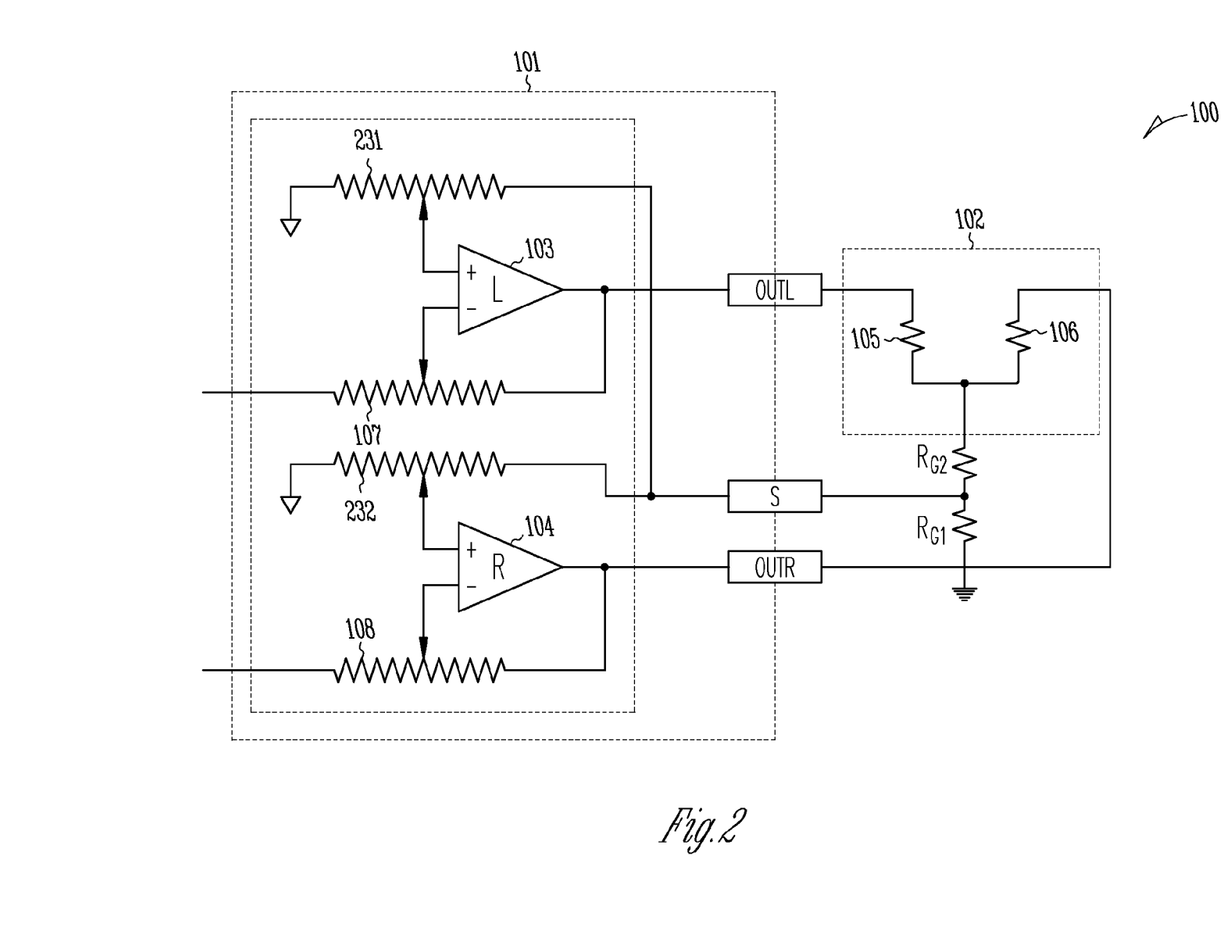
FIG. 2 illustrates generally a modification to the circuit of FIG. 1.

FIG. 2 illustrates generally a modification to the amplifier circuit 100 of FIG. 1, where the feedback from the sense node (S) can be apportioned to track the amplifier circuit gain, thus removing a gain dependency factor of the cancellation technique. In certain examples, the amplifier circuit 101 can include variable feedback impedances 231, 232 to apportion the feedback from the sense node (S). However, the un-sensed parasitic ground impedance (e.g., $R_{G2}$) can remain present as a contributor to crosstalk.

Figure 3:
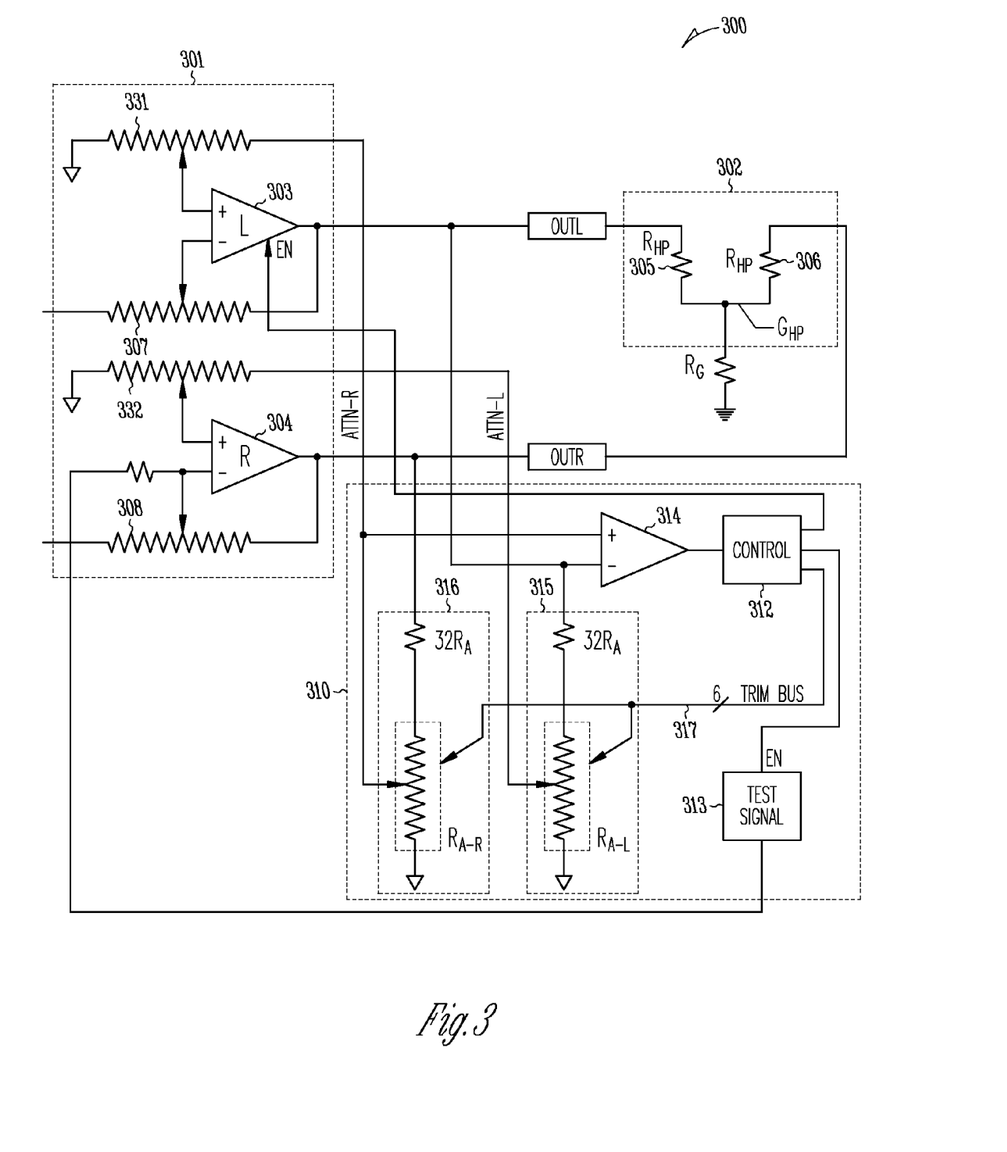
FIG. 3 illustrates generally an example system including a crosstalk cancellation circuit.

FIG. 3 illustrates generally an example of an amplifier system 300 including a crosstalk cancellation circuit 310. The amplifier system 300 can include an amplifier circuit 301, a load 302, and a crosstalk cancellation circuit 310. In certain examples, the amplifier circuit 301 can be configured to be coupled to the load 302, such as a set of headphones or a pair of earpieces 305, 306. The amplifier circuit 301 can include an amplifier for each broadcast channel, such as a left channel amplifier 303 for the left earpiece 305 and a right channel amplifier 304 for the right earpiece 306. In certain examples, the amplifier circuit 301 can include gain control or volume control devices 307, 308 for each channel. In an example, the amplifier circuit 301 can be coupled to the load 302 using one or more nodes or terminals (e.g., OUTL, OUTR) or a connector for connecting the one or more nodes or terminals. In certain examples, the left and right earpieces 305, 306 can share a return path, such as a conductor to ground. Although the return path impedance ($R_G$) can be low, current from one channel can flow through the return path impedance ($R_G$) and can develop crosstalk voltage on another channel that shares the return path.

The crosstalk cancellation circuit 310 can include a controller 312, a test signal generator 313, a comparator 314, and model networks, for example, a first model network 315 and a second model network 316. Each model network 315, 316 can include a model load impedance (e.g., $32R_A$) and a model parasitic impedance (e.g., $R_{A-R}$, $R_{A-L}$. In certain examples, one or more of the model parasitic impedances (e.g., $R_{A-R}$, $R_{A-L}$) can be adjustable, such as via a trim bus 317. The crosstalk cancellation circuit 310 can employ a search routine to "model" or replicate the voltage drop between an intrinsic ground node ($G_{HP}$) of the load 302 and the true circuit ground. As discussed below, the comparator 314 can compare various voltages generated using a test signal to adjust the model parasitic impedances (e.g., $R_{A-R}$, $R_{A-L}$) such that cancellation signals (e.g., ATTN-R, ATTN-L) provide a representation of the voltage drop of each respective channel between the intrinsic ground node ($G_{HP}$) of the load 302 and the true circuit ground. The representation of the voltage drop of each respective channel between the intrinsic ground node ($G_{HP}$) of the load 302 and the true circuit ground can appear internally at the wipers of the variable model parasitic impedances (e.g., $R_{A-L}$, $R_{A-R}$). The cancellation signals (e.g., ATTN-R, ATTN-L) can be applied to the amplifier circuit 301 to cancel crosstalk in other channels and to maintain channel separation at the load 312. The search routine to adjust the model parasitic impedances (e.g., $R_{A-R}$, $R_{A-L}$) can execute in a configuration mode when the system 300 is initially energized, such as during a short window of imposed silence (sound is muted) just prior to the passage of audio to the load 302. In certain examples, the crosstalk cancellation circuit 310 can include a test signal generator 313 to provide the test signal used to determine the setting of each model parasitic impedance (e.g., $R_{A-R}$, $R_{A-L}$) during the search routine. In an example, the controller 312 can include an output (EN) to disable one or more channels, for example, the left channel amplifier 303, during the configuration mode. In such an example, the test signal can be applied to the enabled right channel amplifier 304 and the comparator 314 can be used to adjust the parasitic impedances (e.g., $R_{A-R}$, $R_{A-L}$) via the trim bus 317.

In an example, the crosstalk cancellation circuit 310 can eliminate a terminal (e.g. the sense node, S) from other cancellation examples. In certain examples, the "extra" terminal can be reassigned to a different function—a desirable situation in low terminal-count devices such as audio subsystems in cell phones or portable media players. In the illustrated example of FIG. 3, channel load impedances ($R_{HP}$) are assumed to be about 32 ohms and the model networks 315, 316 of the crosstalk cancellation circuit 310 can be sized based on this assumption, or based on actual knowledge of the channel impedances of the load 302. It is understood that other values of channel load impedance are possible without departing from the scope of the present subject matter. For example, the channel load impedances ($R_{HP}$) can vary between about 16 ohms and about 600 ohms, or in other examples, one or more other ranges. In certain examples, return path induced, or $R_G$-induced, crosstalk can increase with lower values of earpiece impedance (e.g., $R_{HP}$). In addition, other values for impedance of the model networks 315, 316, as well as other ratios of impedance in each model network, are also possible without departing from the scope of the present subject matter.

In certain examples, the amplifier circuit 301 can include variable feedback impedances 331, 332 that are configured to adjust with the volume control devices 307, 308, respectively, thus, removing a gain dependency factor from the crosstalk cancellation technique. In certain examples, an integrated circuit can include the amplifier circuit 301 and the crosstalk cancellation circuit 310. In certain examples, the crosstalk cancellation circuit 310 can be used in mobile electronic devices such as, but not limited to, personal media players or cell phones.

Figure 4:
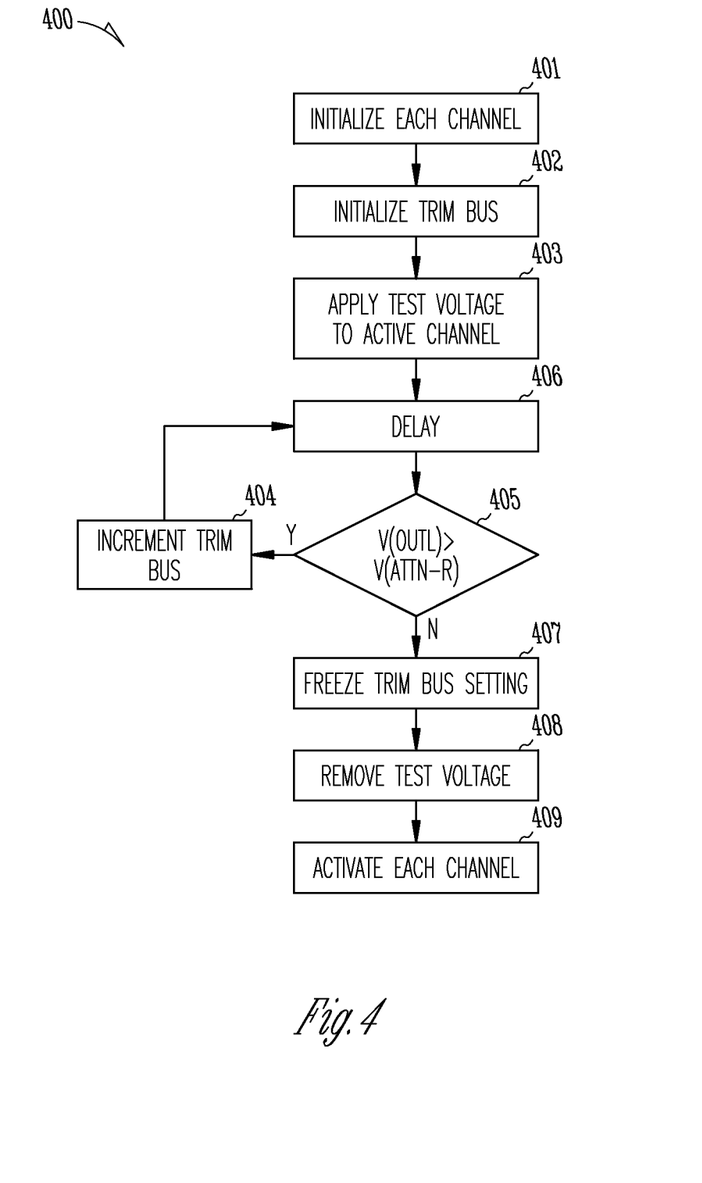
FIG. 4 illustrates generally an example method of configuring a crosstalk cancellation circuit using a search routine.

FIG. 4 illustrates generally an example method 400 of crosstalk cancellation configuration for maintaining channel separation when using channel loads that share a return path. In certain examples, the method can employ a search routine to determine a setting for adjustable impedances that can provide cancellation signals to the amplifier circuit to cancel crosstalk between channel loads due to a shared return path. At 401, the search routine can be initialized. Initializing the search routine can include initiating each channel such as by activating one channel and deactivating the other channel. In an example, deactivating a channel can include establishing a high impedance output state of the channel amplifier. In the illustrated example, the right amplifier can be activated and the left amplifier can be disabled. In an example, the search routine can execute during a configuration mode when an amplifier circuit that is not yet enabled to pass audio such as during the onset of an un-muting sequence or when the amplifier circuit is initially powered. At 402, the method 400 can include initializing a multi-bit trim bus, such as a 6-bit trim bus. In an example, initializing the multi bit trim bus can include adjusting the trim bus to zero (e.g., $R_{A-R}$ and $R_{A-L}$ at lowest setting). At 403, a test voltage can be enabled and applied to an input of the active channel. In certain examples, the test voltage can be a subsonic signal or a signal that can generate sound that is substantially inaudible to a user. An output voltage of the channel processing the test signal can be in the range of about 0.5 volts and about 1.0 volts.

In the illustrated example of FIG. 3, the local ground potential $V(G_{HP})$ of the load 302 can equal $V(OUTR)(R_G/(R_G+R_{HP}))$. Since I(OUTL) equals 0 milliamps, V(OUTL) can be substantially equal to $V(G_{HP})$. The comparator output can provide an indication of the comparison between V(OUTL) and V(ATTN-R).

At 404, if V(OUTL) exceeds V(ATTN-R), the controller can increment the trim bus at 405. In one example, the trim bus can be incremented by one least significant bit when V(OUTL) exceeds V(ATTN-R). After incrementing the trim bus, the controller can again look at the output of the comparator. In an example, at 406, the comparator output can be ignored during a time delay interval after incrementing the trim bus. In an example, the delay interval before evaluating the comparator output after adjusting the trim bus can be about 200 nanoseconds to about 500 nanoseconds or longer. In an example, the interval can be minimized to allow the crosstalk search routine to complete as quickly as possible.

At 407, V(ATTNR) can be at or just above $V(G_{HP})$, as represented by V(OUTL), and the value on trim bus can be frozen. It is understood that instead of the linear search as described above, other search methods are possible using the multi-bit trim bus without departing from the scope of the present subject matter, for example, the trim bus can be set according to a binary weighted search.

The crosstalk cancellation circuit, when calibrated, can accurately sense the crosstalk voltage across $R_G$ because the impedance of the model circuits, $32R_A+R_{A-L}$, for example, is significantly larger than the impedance of the load $R_{HP}$. Therefore, during calibration, the voltage at the output of left channel amplifier due to the test signal applied to the input of the right channel amplifier is equal to the voltage across the impedance $R_G$ of the return path due to the test voltage.

At 408, the test voltage can be disabled, removed, or isolated from the first channel. At 409, the second channel is enabled and audio can be passed through both the right and left channel amplifiers.

In an example, as audio passes through the right and left amplifiers, the crosstalk cancellation circuit can substantially prevent voltage from the right channel amplifier, applied to the right earpiece, from causing audio output on the left earpiece. After setting the trim bus, V(ATTN-R) can equal $V(G_{HP})$. V(ATTN-R) is added into V(OUTL) with unity gain and non-inverting phase to cancel crosstalk. In an example, the unity gain addition can be accomplished using the impedance ladder feeding ATTN-R to the positive input of the left channel amplifier. With this right-to-left cross-feed in place, both V(OUTL) and $V(G_{HP})$ track together as a fixed fraction of V(OUTR), resulting in zero net differential signal at the left earpiece due to voltage at OUTR.

The theory of superposition allows that observations in the preceding method allow the roles of the channels to be reversed (e.g., L and R swapped). In an example, the observations and settings in the preceding method can also be used if both channels are simultaneously active with uncorrelated signals. In an example, the amplitude of the test voltage is somewhat independent of the method and can vary slowly while the crosstalk cancellation method progresses and not degrade the results. In certain examples, the closed loop nature of the method accommodates for example, the left channel amplifier loading the $R_{A-R}$ node (and vice versa). In an example, the test voltage can be applied using a ramp to reduce or eliminate "pop" and "click" in the audio channels.

Figure 5:
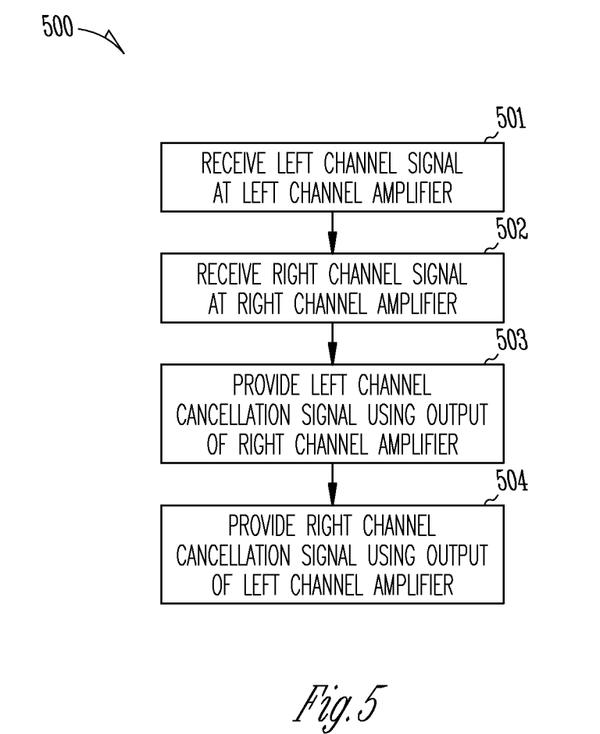
FIG. 5 illustrates generally an example method of crosstalk cancellation.

FIG. 5 illustrates generally an example method 500 of maintaining signal separation between outputs of a first amplifier and a second amplifier as the signals appear at a first and second channel loads. In an example, the first amplifier can include an output configured to be coupled to the first channel load, and the second amplifier can include an output configured to be coupled to the second channel load. In an example, the first and second channel loads can share a conductive return path. At 501, the method can include receiving a first signal, such as a left audio channel signal, at a first input of a first amplifier. At 502, the method can include receiving a second signal, such as a right audio channel signal, at a first input of a second amplifier. At 503, the method can include providing a first cancellation signal to a second input of the first amplifier. The first cancellation signal can include a representation of a scaled version of the second signal. In an example, providing the first cancellation signal can include trimming the signal from the output of the second amplifier using a first trim impedance. At 504, the method can include providing a second cancellation signal to a second input of the second amplifier. The second cancellation signal can include a representation of a scaled version of the first signal. In an example, providing the second cancellation signal can include trimming the signal from the output of the first amplifier using a second trim impedance.

Additional Notes & Examples

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that The claimed invention is:

1. An amplifier circuit comprising:
a first amplifier configured to receive a first input signal and to provide a first output signal to a first load;
a second amplifier configured to receive a second input signal and to provide a second output signal to a second load, wherein the first load and the second load share a conductive return path;
a crosstalk cancellation circuit configured to receive the first output signal and to provide a first cancellation signal to the second amplifier using the first output signal and to receive the second output signal and to provide a second cancellation signal to the first amplifier using the second output signal to reduce crosstalk from the first output signal to the second load and from the second output signal to the first load;
a configuration controller configured to enable the first amplifier and to disable the second amplifier during a configuration mode of the amplifier circuit; and
a comparator configured to compare the first cancellation signal to a processed test signal received at the output of the second amplifier, wherein the first amplifier is configured to process the test signal.

2. The amplifier circuit of claim 1, wherein the crosstalk cancellation circuit includes a first trim impedance configured to receive the first output signal and to provide the first cancellation signal to the second amplifier.

3. The amplifier circuit of claim 2, wherein the first trim impedance includes an adjustable impedance.

4. The amplifier circuit of claim 2, wherein the crosstalk cancellation circuit includes a second trim impedance configured to receive the second output signal and to provide the second cancellation signal to the first amplifier.

5. The amplifier circuit of claim 4, wherein the second trim impedance includes an adjustable impedance.

6. The amplifier circuit of claim 1, including a test signal generator configured to provide the test signal to an input of the first amplifier.

7. A method comprising:
enabling a first amplifier coupled to a first load;
disabling a second amplifier coupled to a second load; wherein the first and second loads share a conductive return path;
receiving a test signal at an input of the first amplifier;
receiving a first representation of the test signal at an output of the second amplifier;
receiving a second representation of the test signal at a first trim impedance coupled to an output of the first amplifier;
comparing the first representation of the test signal with the second representation of the test signal using a crosstalk cancellation circuit; and
adjusting the first trim impedance and a second trim impedance coupled to the output of the second amplifier until the first representation of the test signal is substantially equal to the second representation of the test signal.

8. The method of claim 7, wherein the adjusting includes incrementing a trim value of the first trim impedance until the first representation of the test signal is substantially equal to the second representation of the test signal.

9. The method of claim 8, wherein the adjusting includes incrementing a trim value of the second trim impedance until the first representation of the test signal is substantially equal to the second representation of the test signal.

10. The method of claim 7, wherein the adjusting includes delaying an interval of time before comparing the first representation of the test signal with the second representation of the test signal.

11. The method of claim 10 wherein the interval of time is between about 200 nanoseconds and about 500 nanoseconds.

12. The method of claim 7, wherein the adjusting includes adjusting first and second trim impedances according to a binary weighted search routine until the first representation of the test signal is substantially equal to the second representation of the test signal.

13. The method of claim 7, wherein the receiving a test signal at an input of the first amplifier includes enabling a test signal generator of the crosstalk cancellation circuit.

14. The method of claim 7, wherein the providing a test signal includes providing a substantially inaudible test signal.

15. The method of claim 7, including isolating the test signal from the first amplifier and enabling the second amplifier.

16. An amplifier circuit comprising:
a first amplifier configured to receive a first input signal and to provide a first output signal to a first load;
a second amplifier configured to receive a second input signal and to provide a second output signal to a second load, wherein the first load and the second load share a conductive return path;
a crosstalk cancellation circuit configured to receive the first output signal and to provide a first cancellation signal to the second amplifier using the first output signal and to receive the second output signal and to provide a second cancellation signal to the first amplifier using the second output signal to reduce crosstalk from the first output signal to the second load and from the second output signal to the first load; and
a test signal generator configured to provide a test signal to the first amplifier; and
wherein the crosstalk cancellation circuit is configured to determine a trim setting to provide the first and second cancellation signals using the test signal.

17. The amplifier circuit of claim 16, wherein the crosstalk cancellation circuit includes a first trim impedance configured to receive the first output signal and to provide the first cancellation signal to the second amplifier.

18. The amplifier circuit of claim 17, wherein the first trim impedance includes an adjustable impedance.

19. The amplifier circuit of claim 17, wherein the crosstalk cancellation circuit includes a second trim impedance configured to receive the second output signal and to provide the second cancellation signal to the first amplifier.

20. The amplifier circuit of claim 16, wherein the crosstalk cancellation circuit includes:
a configuration controller configured to enable the first amplifier and to disable the second amplifier during a configuration mode of the amplifier circuit; and
a comparator configured to compare the first cancellation signal to a processed test signal received at the output of the second amplifier, wherein the first amplifier is configured to process the test signal.

* * * * *